(12) United States Patent
Freidhof

(10) Patent No.: US 11,639,965 B2
(45) Date of Patent: May 2, 2023

(54) MEASUREMENT DEVICE AND METHOD FOR MEASURING A DEVICE UNDER TEST

(71) Applicant: Rohde & Schwarz GmbH & Co. KG, Munich (DE)

(72) Inventor: Markus Freidhof, Kirchseeon (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 246 days.

(21) Appl. No.: 15/940,756

(22) Filed: Mar. 29, 2018

(65) Prior Publication Data
US 2018/0284189 A1    Oct. 4, 2018

(30) Foreign Application Priority Data

Mar. 30, 2017    (EP) ..................................... 17163909

(51) Int. Cl.
*G01R 31/00* (2006.01)
*G01R 31/319* (2006.01)
(Continued)

(52) U.S. Cl.
CPC ... *G01R 31/31903* (2013.01); *G01R 31/2879* (2013.01); *G01R 31/30* (2013.01);
(Continued)

(58) Field of Classification Search
CPC ........ G01R 31/31903; G01R 31/31721; G01R 31/2879; G01R 31/2839; G01R 31/40;
(Continued)

(56) References Cited

U.S. PATENT DOCUMENTS 4,907,230 A * 3/1990 Heller ................ G01R 31/2834
706/916
5,773,990 A    6/1998 Wilstrup et al.
(Continued)

FOREIGN PATENT DOCUMENTS

CN    101632026 A    1/2010
CN    104111366 A    10/2014
(Continued)

OTHER PUBLICATIONS

Heitmann et al., EGON: Portable In-Situ Energy Measurement for Low-Power Sensor Devices, 2016 IEEE, 6 pp. (Year: 2016).*
(Continued)

*Primary Examiner* — Toan M Le
(74) *Attorney, Agent, or Firm* — Christensen O'Connor Johnson Kindness PLLC

(57) ABSTRACT

A measurement device is described that comprises a measurement unit configured to perform measurements on an electric signal of a device under test while applying at least one measurement parameter for performing the measurements. The measurement device has an integrated direct current source configured to power the device under test. The measurement device also comprises a monitoring unit configured to monitor at least one monitoring parameter of the direct current source. The measurement device has a control unit configured to control the measurement parameter. Further, a method for measuring a device under test is described.

17 Claims, 2 Drawing Sheets

(51) Int. Cl.
  *G01R 31/28* (2006.01)
  *G01R 31/40* (2020.01)
  *G01R 31/30* (2006.01)
  *G01R 13/02* (2006.01)
  *G01R 31/317* (2006.01)

(52) U.S. Cl.
  CPC .............. *G01R 31/40* (2013.01); *G01R 13/02* (2013.01); *G01R 13/0254* (2013.01); *G01R 31/2839* (2013.01); *G01R 31/31721* (2013.01)

(58) Field of Classification Search
  CPC ........ G01R 31/30; G01R 31/00; G01R 13/02; G01R 13/00; G01R 13/0254
  See application file for complete search history.

(56) References Cited

U.S. PATENT DOCUMENTS

| | | | |
|---|---|---|---|
| 6,593,765 | B1 | 7/2003 | Ishida et al. |
| 7,072,781 | B1 | 7/2006 | Gershon et al. |
| 8,274,295 | B2 | 9/2012 | Grittke et al. |
| 2003/0234652 | A1* | 12/2003 | Bald ................ G01R 35/00 324/551 |
| 2010/0164506 | A1 | 7/2010 | Fruhauf et al. |
| 2013/0205866 | A1 | 8/2013 | Brockhaus |
| 2014/0312877 | A1 | 10/2014 | Kammer |

FOREIGN PATENT DOCUMENTS

| | | |
|---|---|---|
| CN | 105140952 A | 12/2015 |
| EP | 1005708 A1 | 6/2000 |
| EP | 2089913 B1 | 7/2015 |
| JP | H05249191 A | 9/1993 |
| WO | 99/09623 A1 | 2/1999 |

OTHER PUBLICATIONS

IEEE Xplore Search Results, Apr. 28, 2021, 1 pp. (Year: 2021).*
Konstantakos et al., Measurement of Power Consumption in Digital Systems, Oct. 2006, IEEE Transactions on Instrumentation and Measurement, vol. 55, No. 5, pp. 1662-1670 (Year: 2006).*
Extended European Search Report dated Oct. 11, 2017, issued in priority European Application No. 17163909.9, filed Mar. 30, 2017, 10 pages.
Tektronix User Manual "TDS 684A, TDS 744A & TDS 784A Digitizing Oscilloscopes" XP055409876, Feb. 9, 1995, 283 pages.
Tektronix "Mixed Domain Oscilloscopes MDO3000 Series Datasheet," XP055409905, Jan. 18, 2015, 37 pages.

* cited by examiner

MEASUREMENT DEVICE AND METHOD FOR MEASURING A DEVICE UNDER TEST

TECHNICAL FIELD

Embodiments of the present disclosure relate to a measurement device and a method for measuring a device under test by using a measurement device.

BACKGROUND

In research and development applications, a measurement device such as an oscilloscope is used to perform measurements on an electric signal of a device under test, in particular for displaying electric signals such as voltages of the device under test and analyzing these signals with respect to certain properties.

The measurement device, for instance the oscilloscope, has a measuring unit that may apply at least one measurement parameter for the measurements wherein the at least one measurement parameter corresponds to a setting of the measurement unit for performing the dedicated measurement.

During the measurements, the device under test needs to be powered wherein a separately formed power source is typically used. Moreover, measurement devices are known in the state of the art that have an integrated power source, for instance a direct current source, that is configured to power the device under test during the measurements.

However, the measurement unit and the power source are separately controlled such that the measurements are performed independently of the power source, in particular its state.

Since the measurement unit and the power source are independent from each other, effects with regard to the power source cannot be taken into account during the measurements even though these effects may influence physical values of the device under test that are measured during the measurements.

SUMMARY

In view of the above, there is a need for a measurement device that is able, for example, to provide more data that can be used for analyzing purposes.

Embodiments of the present disclosure provide a measurement device comprising a measurement unit configured to perform measurements on an electric signal of a device under test while applying at least one measurement parameter for performing the measurements, an integrated direct current source configured to power the device under test, a monitoring unit configured to monitor at least one monitoring parameter of the direct current source and a control unit configured to control the measurement parameter.

Further, embodiments of the present disclosure provide a method for measuring a device under test by using a measurement device having a measurement unit for performing measurements on an electric signal of the device under test, an integrated direct current source for powering the device under test and a monitoring unit for monitoring at least one monitoring parameter, wherein the measurement unit applies at least one measurement parameter for measuring the device under test and wherein the monitoring unit monitors at least one monitoring parameter of the direct current source.

Accordingly, at least one monitoring parameter of the direct current source is monitored or taken into account during the measurement wherein the at least one monitoring parameter comprises information gathered from the integrated direct current source. This additional data or information can be used for operating the measurement device during the measurements. In other words, the measurement device is enabled to observe parameters of the direct current source while measuring the device under test. Therefore, the measurement device is also configured to observe and detect events with regard to the direct current source. Generally, the measurement device can compare the measurement results obtained, for example the physical values measured at the device under test, and the at least one monitoring parameter of the direct current source in order to obtain additional information. Accordingly, changes of the physical values measured can be compared or put in relation with (probably arising) characteristics of the direct current source while monitoring the direct current source, for example monitoring at least one monitoring parameter. Further, the size and the installation efforts of the measurement system can be reduced as the direct current source for powering the device under test is integrated. Since the measurement unit and the direct current source are housed in a common housing being the one of the measurement device, it is possible to exchange data in an efficient manner without the need of using separate lines. The measuring unit may apply several measurement parameters simultaneously or subsequently, for example upon selection. In general, the measuring parameters correspond to settings of the measurement device for performing the measurements on the device under test, for example obtaining the physical values. The at least one measurement parameter may be a trigger point, a vertical deflection, an offset voltage or another suitable parameter. The additional information/data obtained can be used for analyzing errors in the device under test, for example a printed circuit board of the device under test.

According to an aspect, the control unit is configured to control the measurement parameter in response to the monitoring parameter. Hence, the at least one measurement parameter is controlled in response to the monitoring parameter. The measurement device controls the measurement parameter to be applied in response to the at least one monitoring parameter obtained from the direct current source. Thus, important events such as power up and power down behavior of the direct current source can be detected and taken into account for setting the measurement device appropriately, for example its settings for measuring. Thus, the at least one measurement is controlled appropriately.

According to another aspect, the control unit is further configured to control the output of the direct current source in response to the measurements performed by the measurement unit. Thus, the output of the direct current source is controlled in response to the measurements performed. Accordingly, the measurement device is enabled to control the direct current source with regard to physical values obtained while measuring the device under test. Thus, the measurement device is configured to protect the device under test since the measurement device can shut down the direct current source powering the device under test provided that physical values have been measured that might indicate an unstable operation mode of the device under test.

Furthermore, the measurement device is configured to automatically set the optimal power for measuring the device under test, for example wherein the power level forwarded to the device under test is controlled appropriately. Thus, the measurements are executed under optimal conditions ensuring physical values obtained/measurement results being accurate and trustworthy.

Moreover, the measurement device may control the direct current source such that a sequence of different powers, for instance 1 Volt, 2 Volt and so on, is used for powering the device under test, for example during a (predefined) test scenario. Thus, it is no more necessary that the operator has to change the voltages applied to the device under test manually.

In some embodiments, the monitoring unit is a hardware circuit. Thus, the monitoring unit is realized by hardware components that may be realized on a printed circuit board.

Another aspect provides that the measurement unit is configured to be initiated to perform a measurement by the monitoring parameter. A measurement is initiated by the at least one monitoring parameter. Thus, a changing behavior of the direct current source may initiate a measurement. In general, the measurement unit is configured to initiate a measurement upon a control signal related to a monitoring parameter monitored. Further, the measurement device may be an oscilloscope such that the measuring unit is triggered by the monitoring parameter accordingly. Hence, the measurement device, namely the oscilloscope, is configured to automatically trigger on a certain monitoring parameter.

In some embodiments, the measurement unit is configured to be initiated to perform a measuring by monitoring the power off and/or power on of the direct current source. A measurement is initiated by the power off and/or power on of the direct current source. Accordingly, the measurement unit is configured to initiate a measurement upon a control signal related to the power off and/or power on of the direct current source. Provided that the measurement device is an oscilloscope, the measuring unit can be triggered by the power off and/or power on of the direct current source. Thus, the power status of the device under test can be viewed directly by the operator of the measurement device, for example wherein a possible effect of the changing power status on the physical value(s) measured is shown provided that the measuring device is an oscilloscope that triggers on the monitoring parameter. In some embodiments, a separate channel of the oscilloscope does not have to be occupied for triggering on the power characteristics of the device under test as this is done internally. Hence, the measurements are simplified appropriately.

According to another aspect, the power consumption is a monitoring parameter. The power consumption of the direct current source is measured as a monitoring parameter wherein a measurement is initiated in response to a change in the power consumption. For instance, the current consumption is used as monitoring parameter. Thus, the power consumption of the device under test is measured within the direct current source. This monitoring parameter can be used to analyze the reason for changes of the physical values measured during the measurement of the device under test. The measurement unit may be triggered by the power consumption monitored, for example a changing power consumption. Further, it is possible to automatically start a measurement while the power consumption of the device under test is monitored by the monitoring unit.

The control unit may be configured to switch the direct current source on or off in response to physical values measured by the measurement device at the device under test. Hence, the direct current source is switched on or off in response to physical values obtained from the device under test. This ensures that the measurement device is able to protect the device under test connected to the direct current source of the measuring device. The measurement parameters obtained may indicate an unstable operation mode of the device under test such that the measurement device controls the direct current source appropriately in order to switch off the direct current source while protecting the device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
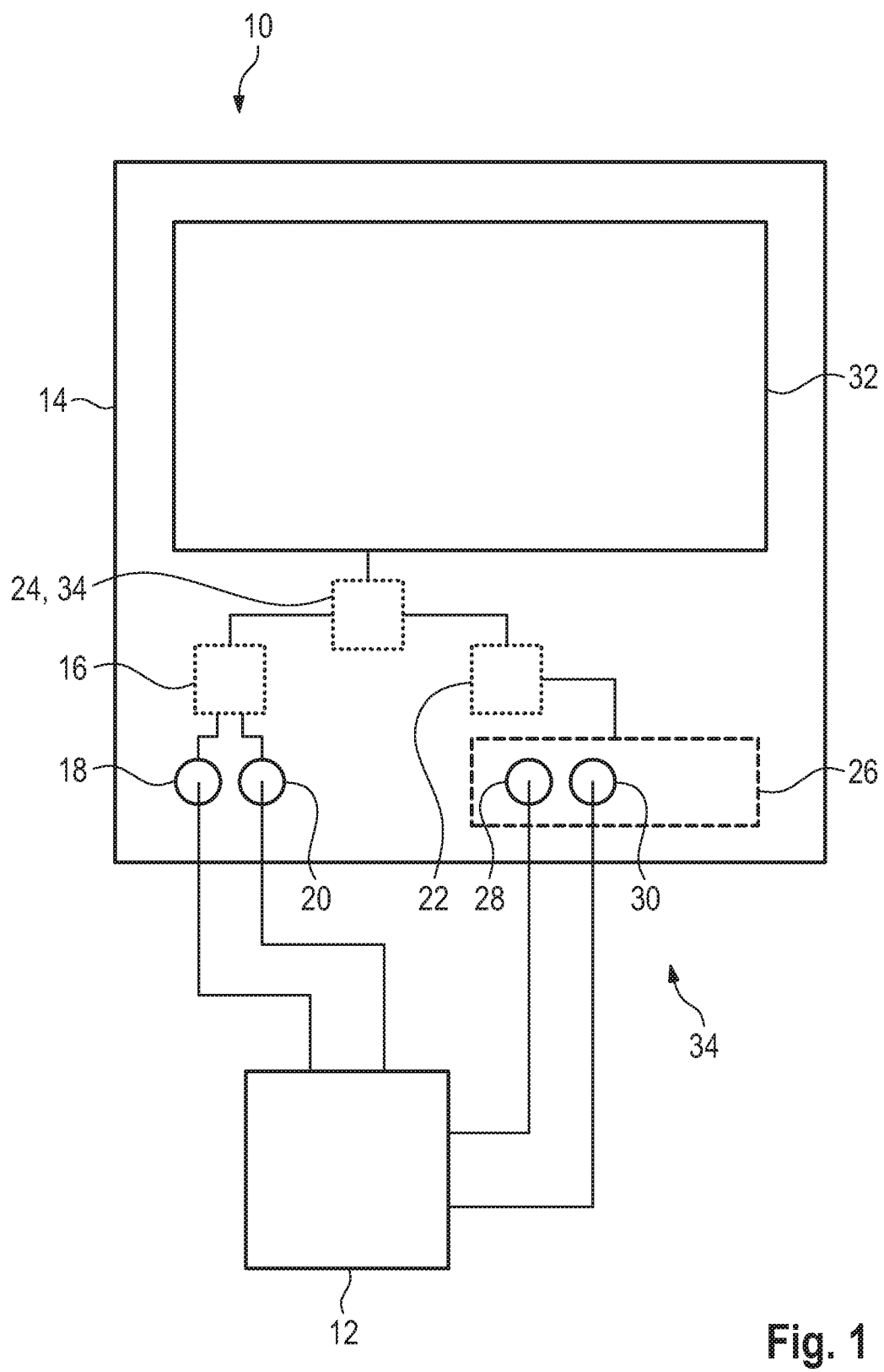
FIG. 1 schematically shows a measurement system with a measurement device.

In FIG. 1, a measurement device 10 is shown that is used for measuring a device under test 12. In the shown embodiment, the measurement device 10 is an oscilloscope. As shown in FIG. 1, the measurement device 10 has a housing 14 which encompasses a measurement unit 16 being allocated to inputs 18, 20, a monitoring unit 22, a control unit 24 and an integrated direct current source 26. The integrated direct current source 26 has two outputs 28, 30 for powering the device under test 12 to be measured. Further, the measurement device 10 has a display 32 that is used for displaying data obtained by a processing unit 34 of the measurement device 10. In the shown embodiment, the processing unit 34 and the control unit 24 are formed as a single unit.

The measurement unit 16 is configured to perform measurements on an electric signal of the device under test 12 wherein the electric signal is fed to the measurement device 10 via the inputs 18, 20. For this purpose, the measurement unit 16 is configured to apply at least one measurement parameter such as a trigger point, a vertical deflection, an offset voltage or another suitable parameter used by the oscilloscope for analyzing the electric signal. Accordingly, the at least one measurement parameter applied corresponds to a setting of the measurement device 10 while performing the measurements on the device under test 12. The measurement unit 16 may apply more than one measurement parameter simultaneously.

The monitoring unit 22 is configured to monitor at least one monitoring parameter of the direct current source 26 during the measurements, for instance a power status of the direct current source 26 or the power consumption of the device under test 12 being powered by the direct current source 26. As the direct current source 26 is configured to power the device under test 12, the at least one monitoring parameter obtained can be used in conjunction with the physical values measured from the device under test 12, for instance for comparison purposes. Thus, the monitoring parameter and the physical values can be analyzed or out in relation with each other for analyzing purposes.

Both the measurement unit 16 as well as the monitoring unit 22 are connected to the control unit 24 such that the measurement parameter(s) as well as the monitoring parameter(s) are taken into account during the measurements of the electric signal. Furthermore, the control unit 24 is configured to control the measurement unit 16, for example the measurement parameter(s) applied, as well as the direct current source 26, for example the output of the direct current source 26 such as the power status. In addition, the control unit 24 is configured to control the measurement unit 16, for example the measurement parameter(s) applied, in response to the monitoring parameter(s) obtained by the monitoring unit 22. In some embodiments, the control unit 24 is configured to control the output of the direct current source 26 in response to the physical values obtained during the measurements performed by the measurement unit 16.

The monitoring unit 22 may be established by a hardware circuit being integrated in the measurement device 10.

In general, the measurement device 10 and the device under test 12 provide a measurement system 34.

Figure 2:
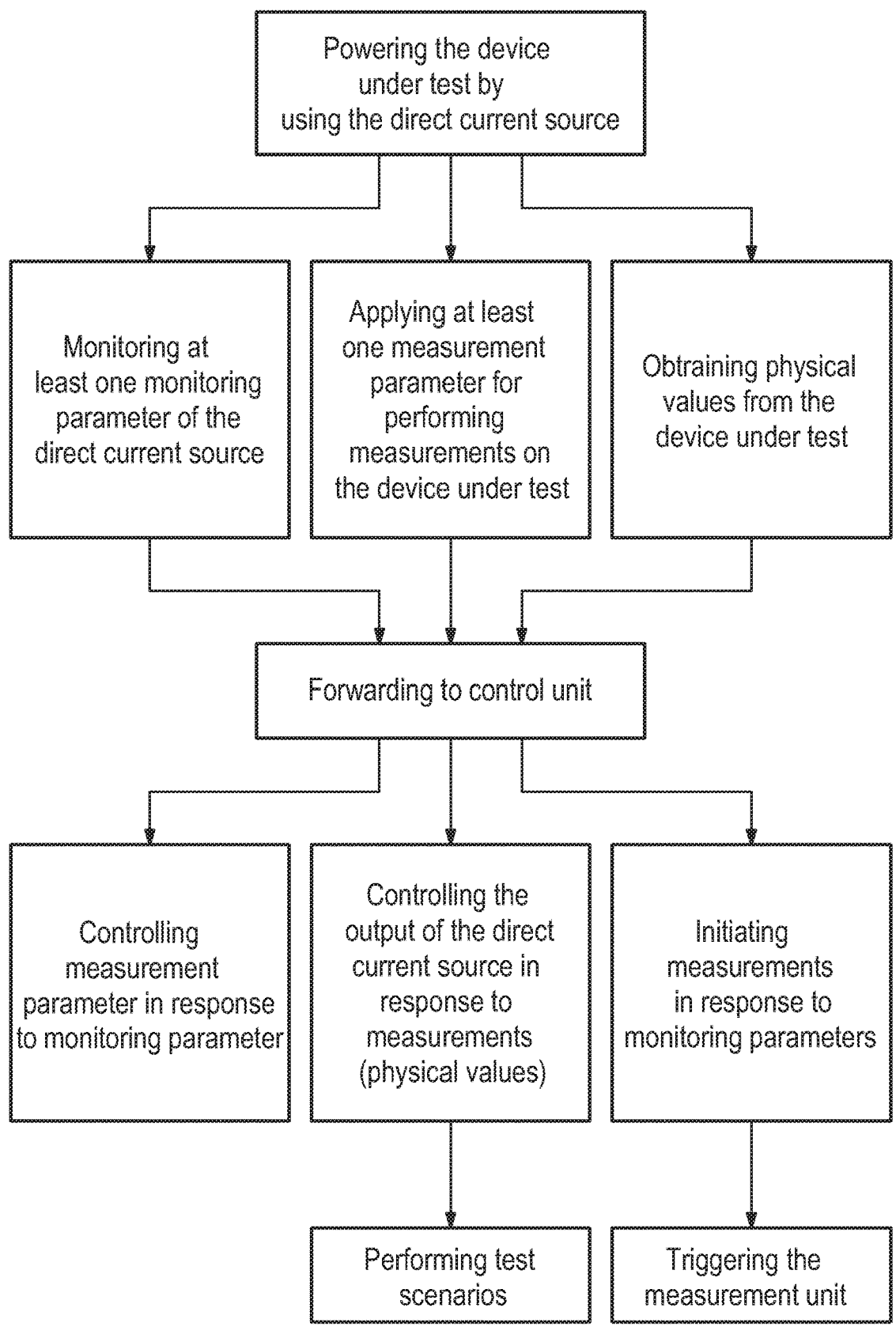
FIG. 2 shows a flow-chart of a method for measuring a device under test.

The different data obtained while measuring the electric signal of the device under test 12 will be described with reference to the flow-chart shown in FIG. 2 representing a method for measuring the device under test 12.

The measurement device 10 performs measurements on the device under test 12 that is powered by the integrated direct current source 26 during the measurements.

As already mentioned, the monitoring unit 22 monitors at least one monitoring parameter of the direct current source 26 such as the power consumption of the device under test 12, for example changes of the power consumption, or the status of the direct current source 26.

Further, the measuring unit 16 applies at least one measuring parameter for performing the measurements on the device under test 12 such as a trigger point, a vertical deflection, an offset voltage or another suitable parameter. The measurement parameter is applied to the signal(s) fed to the measurement device 10 via the inputs 18, 20 that is/are processed by the measuring unit 16.

In addition, the measurement device 10 is configured to obtain physical values from the device under test 12 during the measurements, for example from the signals fed to the measurement device 10 via the inputs 18, 20. These physical values represent the measurement results.

All these variables are forwarded to the control unit 24 that is configured to control the measurement unit 16 and the direct current source 26 appropriately, for example in response to the monitoring parameters and the physical values obtained, respectively.

For instance, the control unit 24 may control the output of the direct current source 26 in response to the physical values obtained from the device under test 12. Thus, the powering of the device under test 12 can be controlled. This ensures that the measurement device 10 can protect the device under test 12 during the measurements if the control unit 24 detects a critical operation mode of the device under test 12. The control unit 24 may detect this critical operation mode by analyzing the physical values obtained during the measurements.

Generally, the control unit 24 is configured to control the output of the direct current source 26 in response to measurements performed by the measurement unit 16.

Furthermore, the measurement device 10, for example the control unit 24, automatically sets the optimal power for measuring the device under test 12 by setting the integrated direct current source 26 appropriately. Hence, the power level of the power forwarded to the device under test 12 is controlled appropriately ensuring that the device under test 12 is powered in an optimized manner with regard to the measurement performed by the measurement device 10, for example the measurement unit 16.

Moreover, the measurement device 10 can control the direct current source 26 such that a sequence of different powers is used for powering the device under test 12 during a certain test scenario. For instance, a voltage of 1 Volt is applied for a certain time that is raised to 2 Volt for a certain time and so on. Thus, it is no longer necessary that the operator of the measurement device 10 has to change the voltages applied to the device under test 12 manually. A test scenario can be performed in an automatic manner.

Furthermore, the control unit 24 is also configured to switch off the direct current source 26 in response to the physical values obtained in order to protect the device under test 12. Accordingly, the device under test 12 is protected by the measurement device 10 as an over-current or any other critical operating state can be prevented.

In addition, the control unit 24 controls the measurement unit 16 in response to the at least one monitoring parameter that is provided by the monitoring unit 22, for example adjusting the at least one measurement parameter in response to the monitoring parameter. For instance, the at least one monitoring parameter may be a power-off or power-on status of the direct current source 26.

Thus, the control unit 24 may initiate a measurement to be performed by the measurement unit 16. For instance, the control unit 24 triggers the measurement unit 16 of the measurement device 10 being an oscilloscope. Accordingly, a certain measurement on the device under test 12 is performed once a changing status of the direct current source 26 has been detected. In some embodiments, the physical values obtained by the device under test 12 are output around the trigger event, for example displayed.

Thus, the control unit 24 is configured to trigger the measurement unit 16 in order to start measurements on the device under test 12 once a changing power consumption has been detected by the control unit 24 in cooperation with the monitoring unit 22.

Triggering on the at least one monitoring parameter, for example a changing power consumption, ensures that the reason for the changing characteristics of the device under test 12 can be verified, for example the changing power consumption. The changing power consumption corresponds to a power up or a power down of the device under test 12 during the measurements.

Moreover, a power status of the direct current source 26 may be taken into account such as the power off and/or the power on of the direct current source 26. The measurement unit 16 may be triggered on that monitoring parameter(s) such that a measurement is initiated. The characteristics of the device under test 12 can be directly observed during the power on and/or power off state while triggering on this monitoring parameter.

In general, a measurement device 10 is provided that can be used to obtain more information with regard to the device under test 12, for example with regard to the device under test 12 and its powering conditions.

The control unit 24, processing unit 34, or other components described herein may include, in some embodiments, logic for implementing the functionalities, technologies and methodologies described herein. This logic of the control unit 24, processing unit 34, or other components can be carried out in either hardware or software, or a combination of hardware and software. In some embodiments, the control unit 24, processing unit 34, or other components includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the control unit 24, processing unit 34, or other components includes a microprocessor and a memory storing logic modules and/or instructions. In an embodiment, the control unit 24, processing unit 34, or other components includes one or more ASICs having a plurality of predefined logic components. In an embodiment, the control unit 24, processing unit 34, or other components includes one or more FPGA having a plurality of programmable logic components. In an embodiment, the control unit 24, processing unit 34, or other components includes hardware circuit implementations (e.g., implementations in analog circuitry, implementations in digital circuitry, and the like, and combinations thereof). In an embodiment, the control unit 24, processing unit 34, or other components includes combinations of circuits and computer program products having software or firmware instructions stored on one or more computer readable memories that work together to cause a device to perform one or more functionalities, methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement device having a plurality of measurement settings, the measurement device comprising:
a measurement unit configured to perform measurements on an electric signal of a device under test while applying at least one of the plurality of measurement settings for performing the measurements, wherein the electric signal is an output signal of the device under test;
an integrated direct current source configured to power the device under test;
a monitoring circuit configured to monitor at least one monitoring parameter of the direct current source, the at least one monitoring parameter comprising information gathered from the integrated direct current source; and
a control circuit configured to control selection of the measurement setting, wherein the control circuit is configured to adjust the at least one applied measurement setting in response to the monitoring parameter monitored by the monitoring circuit, wherein the at least one monitoring parameter comprises a power consumption of the direct current source.

2. The measurement device according to claim 1, wherein the control circuit is further configured to control the output of the direct current source in response to the measurements performed by the measurement unit.

3. The measurement device according to claim 1, wherein the monitoring circuit is a hardware circuit.

4. The measurement device according to claim 1, wherein the measurement unit is configured to be initiated to perform a measurement by the monitoring parameter.

5. The measurement device according to claim 1, wherein the measurement unit is configured to be initiated to perform a measurement by monitoring at least one of the power off and power on of the direct current source.

6. The measurement device according to claim 1, wherein the control circuit is configured to switch the direct current source on or off in response to physical values measured by the measurement device at the device under test.

7. The measurement device according to claim 1, wherein the control circuit is further configured to control the output of the direct current source in response to the measurements performed by the measurement unit; and wherein the measurement device is configured to protect the device under test since the measurement device shuts down the direct current source powering the device under test provided that physical values have been measured that might indicate an unstable operation mode of the device under test.

8. The measurement device of claim 1, wherein adjustment of the at least one applied measurement setting by the control circuit includes changing from the at least one of the plurality of measurement settings to a different measurement setting of the plurality of measurement settings.

9. The measurement device of claim 1, wherein the plurality of measurement settings are selected from a group consisting of a trigger point, a vertical deflection, and an offset voltage.

10. The measurement device of claim 1, wherein the at least one monitoring parameter comprises a status of the direct current source.

11. A method for measuring a device under test by using a measurement device having a plurality of measurement settings, the measurement device comprising a measurement unit for performing measurements on an electric signal of the device under test, wherein the electric signal is an output signal of the device under test, an integrated direct current source for powering the device under test, and a monitoring circuit for monitoring at least one monitoring parameter, wherein the at least one monitoring parameter comprises a power consumption of the direct current course, the method comprising:
applying, by the measurement unit, at least one of the plurality of measurement settings for measuring the device under test; and
monitoring, by the monitoring circuit, at least one monitoring parameter of the direct current source, the at least one monitoring parameter comprising information gathered from the integrated direct current source,
wherein selection of the measurement setting is controlled in response to the monitoring parameter monitored by the monitoring circuit, wherein the at least one applied measurement setting is adapted in response to the monitoring parameter monitored by the monitoring circuit.

12. The method according to claim 11, wherein a measurement is initiated by the at least one monitoring parameter.

13. The method according to claim 11, wherein a measurement is initiated by at least one of the power off and power on of the direct current source.

14. The method according to claim 11, wherein a measurement is initiated in response to a change in the power consumption.

15. The method according to claim 11, wherein the output of the direct current source is controlled in response to the measurements performed.

16. The method according to claim 11, wherein the direct current source is at least one of switched on and switched off in response to physical values obtained from the device under test.

17. A measurement device having a plurality of measurement settings, the measurement device comprising:
- a measurement unit configured to perform measurements on an electric signal of a device under test while applying at least one of the plurality of measurement settings for performing the measurements, wherein the electric signal is an output signal of the device under test;
- an integrated direct current source configured to power the device under test;
- a monitoring circuit configured to monitor at least one monitoring parameter of the direct current source wherein the at least one monitoring parameter comprises a power consumption of the direct current source; and
- a control circuit configured to control selection of the measurement setting, wherein the measurement device is enabled to observe parameters of the direct current source while measuring the device under test such that changes of physical values measured during the measurements are compared or put in relation with characteristics of the direct current source while monitoring the at least one monitoring parameter, wherein the control circuit is configured to adjust the at least one applied measurement setting in response to the monitoring parameter monitored by the monitoring circuit.

* * * * *